(12) United States Patent
Li et al.

(10) Patent No.: US 6,812,135 B2
(45) Date of Patent: Nov. 2, 2004

(54) ADHESION ENHANCEMENT BETWEEN CVD DIELECTRIC AND SPIN-ON LOW-K SILICATE FILMS

(75) Inventors: Lain-Jong Li, Hsinchu (TW); Shen-Nan Lee, Hsinchu (TW)

(73) Assignee: Taiwan Semiconductor Manufacturing Company, LTD, Hsin-Chu (TW)

( * ) Notice: Subject to any disclaimer, the term of this patent is extended or adjusted under 35 U.S.C. 154(b) by 0 days.

(21) Appl. No.: 10/283,517

(22) Filed: Oct. 30, 2002

(65) Prior Publication Data

US 2004/0087122 A1 May 6, 2004

(51) Int. Cl.⁷ .......................................... H01L 21/4763
(52) U.S. Cl. ...................... 438/628; 438/623; 438/624; 438/644; 438/763; 438/780; 438/781
(58) Field of Search ................................ 438/780, 763, 438/786, 623, 624, 628, 644, 781; 427/245

(56) References Cited

U.S. PATENT DOCUMENTS

| | | | | |
|---|---|---|---|---|
| 4,238,528 A | | 12/1980 | Angelo et al. ................. | 427/96 |
| 5,556,806 A | * | 9/1996 | Pan et al. ..................... | 438/624 |
| 5,965,202 A | | 10/1999 | Taylor-Smith et al. ....... | 427/245 |
| 5,998,103 A | * | 12/1999 | Zhang ........................... | 430/327 |
| 6,008,540 A | * | 12/1999 | Lu et al. ....................... | 257/758 |
| 6,121,159 A | * | 9/2000 | Pasch ........................... | 438/780 |
| 6,153,512 A | * | 11/2000 | Chang et al. ................. | 438/624 |
| 6,180,518 B1 | | 1/2001 | Layadi et al. ................ | 438/639 |
| 6,303,523 B2 | | 10/2001 | Cheung et al. .............. | 438/780 |
| 6,303,524 B1 | | 10/2001 | Sharangpani et al. ....... | 438/780 |
| 6,418,875 B1 | * | 7/2002 | Annapragada ........... | 118/723 R |
| 6,599,846 B2 | * | 7/2003 | Komatsu et al. ............ | 438/781 |
| 6,677,231 B1 | * | 1/2004 | Tsai et al. .................... | 438/624 |

* cited by examiner

*Primary Examiner*—Maria Guerrero
(74) *Attorney, Agent, or Firm*—Haynes and Boone, LLP

(57) ABSTRACT

A method of adhering a silicate layer to dielectric layer comprising the following steps. A structure having an overlying dielectric layer formed thereover is provided. An adhesion promoter layer is formed upon the dielectric layer. The adhesion promoter layer including adhesion promotion molecules. The dielectric layer and the adhesion promoter layer are treated to a low-temperature treatment to bind at least some of the adhesion promotion molecules to the dielectric layer. A silicate layer is formed upon the low-temperature treated adhesion promoter layer. The silicate layer and the low-temperature treated adhesion promoter layer are treated to a high-temperature treatment to bind at least some of the adhesion promotion molecules to the silicate layer whereby the silicate layer is adhered to the dielectric layer.

60 Claims, 7 Drawing Sheets

Dihydroxyl terminated molecule alkoxysilyl hydroxyl terminated molecule

Alkoxysilyl terminated epoxides

Alkoxysilyl vinyl terminated molecule

Hydroxyl vinyl terminated molecule

Alkoxysilyl acryl terminated molecule

Hydroxyl acryl terminated molecule

_US 6,812,135 B2_

ADHESION ENHANCEMENT BETWEEN CVD DIELECTRIC AND SPIN-ON LOW-K SILICATE FILMS

BACKGROUND OF THE INVENTION

Adhesion between chemical vapor deposition (CVD) barrier dielectric layers, or via etch-stop layers, and silicate (SiO based materials) low-k films, or solution-gelation (SOL-GEL) processed films, is a major concern in microelectronics integration. Weak adhesion at this interface results in film delamination during subsequent processing. In current practice, such adhesion is very low, on the order of less than about 0.12 GPa/√M (giga parcel/square root meter), which results in severe peeling.

U.S. Pat. No. 6,303,524 B1 to Sharangpani et al. describes low-k curing methods that affect adhesion.

U.S. Pat. No. 6,303,523 B2 to Cheung et al. describes a low-k film deposition process to improve adhesion.

U.S. Pat. No. 6,180,518 B1 to Layadi et al. describes a method of forming vias in a low-k dielectric material and discusses low-k layer adhesion problems.

U.S. Pat. No. 4,238,528 to Angelo et al. describes adhesion promoters for polyamides.

U.S. Pat. No. 5,965,202 to Taylor-Smith et al. describes coupling agents between low-k layers.

SUMMARY OF THE INVENTION

Accordingly, it is an object of one or more embodiments of the present invention to provide enhanced adhesion between dielectric films and silicate films.

It is another object of one or more embodiments of the present invention to provide enhanced adhesion between CVD dielectric films and spin-on low-k silicate films.

Other objects will appear hereinafter.

It has now been discovered that the above and other objects of the present invention may be accomplished in the following manner. Specifically, a structure having an overlying dielectric layer formed thereover is provided. An adhesion promoter layer is formed upon the dielectric layer. The adhesion promoter layer including adhesion promotion molecules. The dielectric layer and the adhesion promoter layer are treated to a low-temperature treatment to bind at least some of the adhesion promotion molecules to the dielectric layer. A silicate layer is formed upon the low-temperature treated adhesion promoter layer. The silicate layer and the low-temperature treated adhesion promoter layer are treated to a high-temperature treatment to bind at least some of the adhesion promotion molecules to the silicate layer whereby the silicate layer is adhered to the dielectric layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Initial Structure

Figure 1:
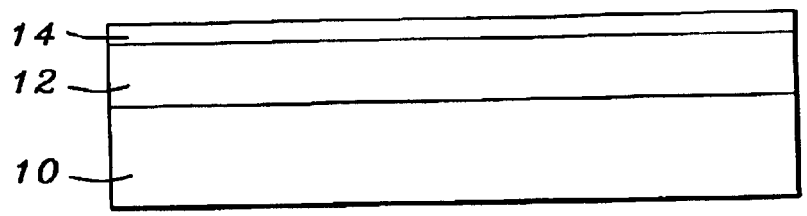
FIGS. 1 to 4 schematically illustrates a preferred embodiment of the present invention.

As shown in FIG. 1, structure 10 has an overlying layer 12 formed thereover. Layer 12 may function as, for example a barrier layer or a via etch-stop layer.

Structure 10 is preferably understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Structure 10 may be a silicon wafer or a silicon substrate.

Layer 12 may be a chemical vapor deposition (CVD) dielectric layer or a spin-on dielectric layer and is preferably comprised of silicon dioxide ($SiO_2$), silicon carbide (SiC), silicon oxynitride (SiON), carbon-doped silicon oxide (SiOC), silicon nitride (SiN) or silicon carbo-oxynitride (SiCNO). Layer 12 may also be a metal layer preferably such as copper (Cu), aluminum (Al), gold (Au) or silver (Ag).

It is noted that if layer 12 is a CVD dielectric layer, then layer 18 is a spin-on dielectric layer and if layer 12 is a spin-on dielectric layer, then layer 18 is a CVD dielectric layer.

Layer 12 has a thickness of preferably from about 300 to 5000 Å and more preferably from about 300 to 600 Å.

In one key step of the invention, an adhesion promoter layer 14 is then coated upon layer 12 to improve the adhesion between layer 12 and Adhesion promoter layer 14 has a thickness of preferably from about 20 to 300 Å and more preferably from about 50 to 150 Å.

Figure 5:
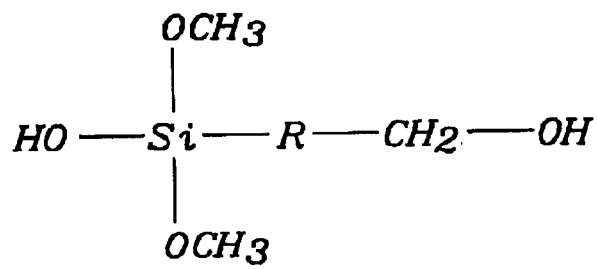
FIGS. 5 to 7 illustrate the first series of adhesion promotion molecules.
Figure 6:
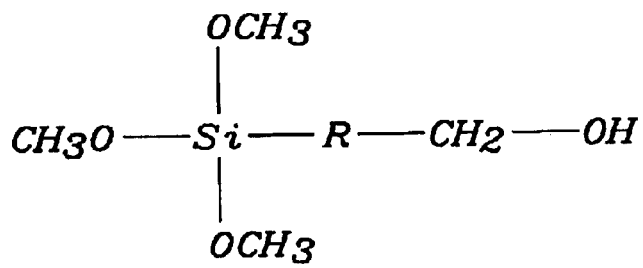
Figure 7:
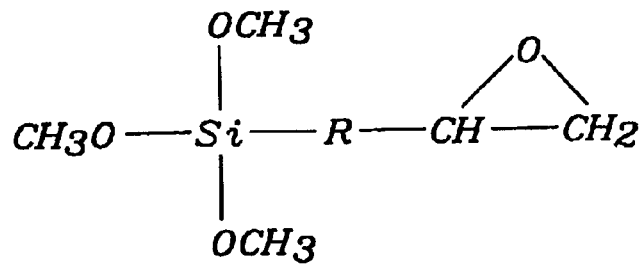

Adhesion promoter layer 14 is comprised of adhesion promotion molecules selected from one of three series of adhesion promotion molecules such as (1) a first series: dihydroxyl-terminated molecules; (2) a second series: hydroxyl-/alkoxysilyl-terminated molecules; or (3) a third series: hydroxylvinyl or hydroxylacryl-terminated molecules. That is, for example:

1. first series of adhesion promotion molecules as shown in FIGS. 5 to 7, i.e.:
   a) dihydroxyl terminated molecules as shown in FIG. 5;
   b) alkoxysilyl hydroxyl terminated molecules as shown in FIG. 6; or
   c) alkoxysilyl terminated molecules as shown in FIG. 7;

where R is —$CH_2$—, —$CH_2$—$CH_2$—, —$CH_2$—$CH_2$—$CH_2$—, etc.; and where R may further include an ether [—$CH_2$—O—$CH_2$—] or ester

Figure 8A:
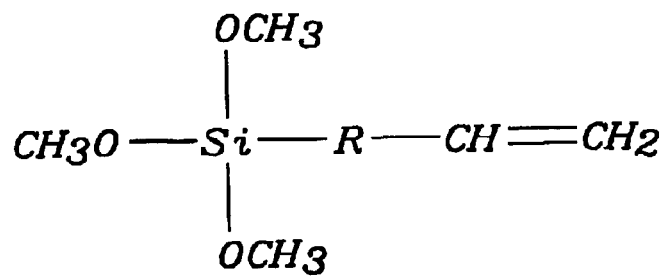
FIGS. 8A, 8B, 9A and 9B illustrate the second series of adhesion promotion molecules.
Figure 8B:
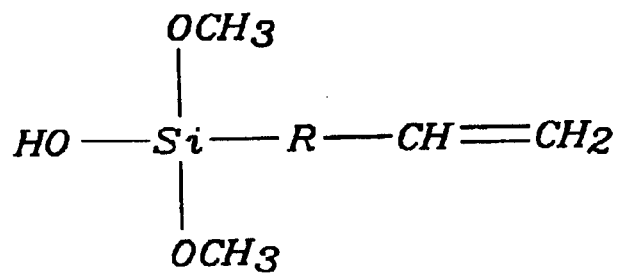
Figure 9A:
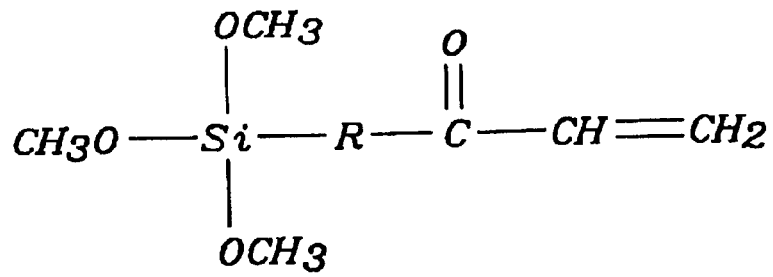
Figure 9B:
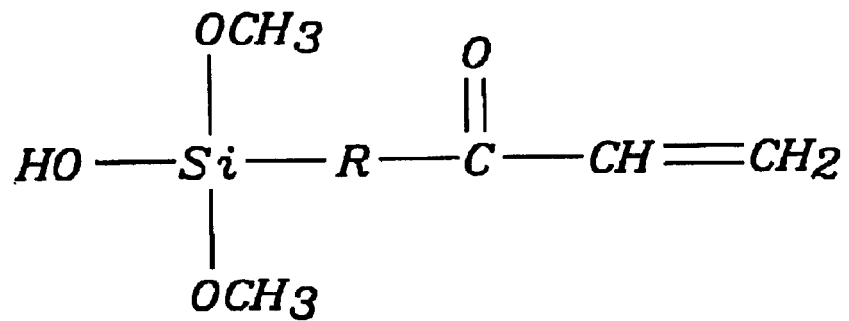

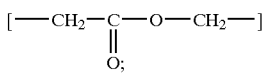

linkage;

2. second series of adhesion promotion molecules as shown in FIGS. 8A, 8B, 9A and 9B, i.e.:
   a) alkoxysilyl vinyl terminated molecules as shown in FIG. 8A;
   b) hydroxyl vinyl terminated molecules as shown in FIG. 8B;
   c) alkoxysilyl acryl terminated molecules as shown in FIG. 9A; or
   d) hydroxyl acryl terminated molecules as shown in FIG. 9B;

where R is —$CH_2$—, —$CH_2$—$CH_2$—, —$CH_2$—$CH_2$—$CH_2$—, etc.; and where R further include an ether [—$CH_2$—O—$CH_2$—]or ester

Figure 10:
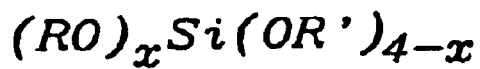
FIGS. 10 and 11 illustrate the third series of adhesion promotion molecules.
Figure 11:
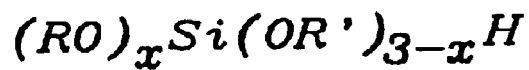

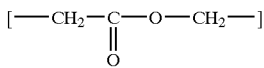

linkage; or 3. third series of adhesion promotion molecules as shown in FIGS. 10 and 11, i.e.:
   a) $(RO)_xSi(OR')_{4-x}$ as shown in FIG. 10; or
   b) $(RO)_xSi(OR')_{3-H}$ as shown in FIG. 11 where R is methyl (—$CH_3$), ethyl (—$CH_2CH_3$), propyl (—$CH_2CH_2CH_3$), etc. and where R' is —$CH_2$—, —$CH_2$—$CH_2$—, —$CH_2$—$CH_2$—$CH_2$—, etc.; and where R may further include an ether or ester

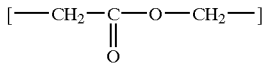

linkage.

Of the three series of molecules, the first series (as a group) is more preferred. Of the molecules, the alkoxysilyl hydroxyl terminated molecules as shown in FIG. 6, the alkoxysilyl terminated molecules as shown in FIG. 7, the alkoxysilyl vinyl terminated molecules as shown in FIG. 8A and the alkoxysilyl acryl terminated molecules as shown in FIG. 9A are more preferred with the alkoxysilyl terminated molecules as shown in FIG. 7 being most preferred.

Low-Temperature Treatment 16

Figure 2:
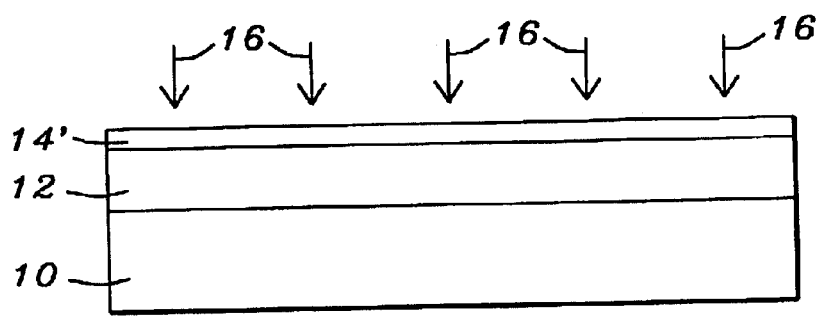

As shown in FIG. 2, the structure of FIG. 1 is subjected to a low-temperature treatment 16 to bind the adhesion promotion molecules of adhesion promoter layer 14 to layer 12, forming low-temperature treated adhesion promoter layer 14'.

The low temperature treatment 16 is conducted under the following conditions for:

I. the first series of adhesion promotion molecules as shown in FIGS. 5 to 7:
   temperature: preferably from about 150 to 250° C. and more preferably from about 180 to 230° C.; and
   time: preferably from about 3 to 10 minutes and more preferably from about 5 to 8 minutes; and II. the second series of adhesion promotion molecules as shown in FIGS. 8A, 8B, 9A and 9B, and the third series of adhesion promotion molecules as shown in FIGS. 10 and 11:
   temperature: preferably from about 150 to 250° C. and more preferably from about 180 to 230° C.; and
   time: preferably from about 3 to 30 minutes and more preferably from about 10 to 20 minutes.

Formation of Spin-on Low-k Silicate Layer 18

Figure 3:
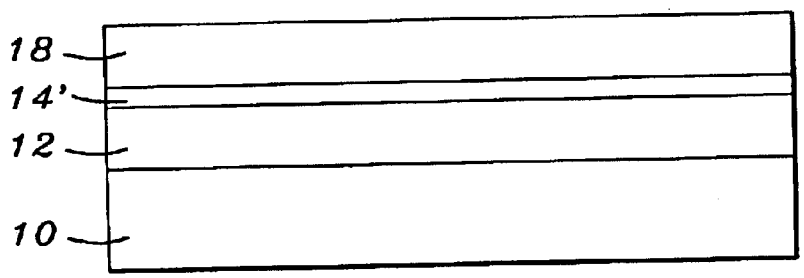

As shown in FIG. 3, a layer 18 is formed over low-temperature treated adhesion promoter layer 14' to a thickness of preferably from about 500 to 8000 Å and more preferably from about 3000 to 6000 Å. As noted above, if layer 12 is a CVD dielectric layer, then layer 18 is a spin-on dielectric layer and if layer 12 is a spin-on dielectric layer, then layer 18 is a CVD dielectric layer.

Preferably, layer 12 is a CVD dielectric layer and layer 18 is a spin-on low-k silicate/SiO based material as will be used for illustrative purposes hereafter.

Spin-on low-k silicate layer 18 is comprised of silicon (Si), oxygen (O) and carbon (C) atoms (also see the description of layer 12).

High-Temperature Treatment 20

Figure 4:
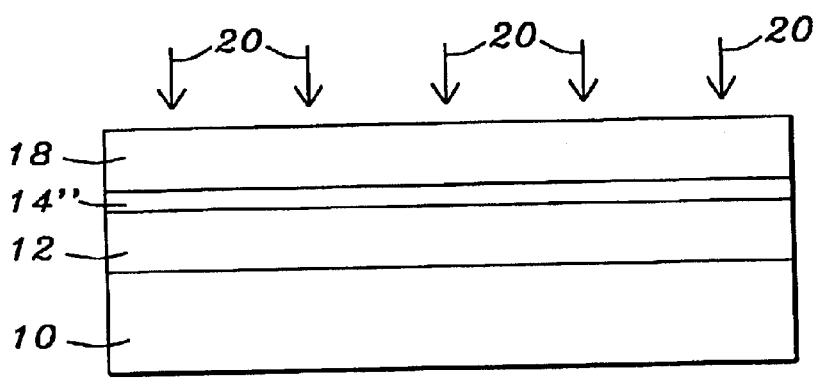

As shown in FIG. 4, the structure of FIG. 3 is subjected to a high-temperature treatment 20 to bind the spin-on low-k silicate layer 18 to CVD dielectric layer 12 via the high-temperature treated adhesion promoter layer 14".

The high temperature treatment 20 is conducted under the following conditions for the first, second and third series of adhesion promotion molecules:
   temperature: preferably from about 300 to 450° C. and more preferably from about 350 to 420° C.; and
   time: preferably from about 1 to 6 hours and more preferably from about 2 to 4 hours.

The high-temperature treatment 20 cures the double bonds of the second series of adhesion promotion molecules being either vinyl or acryl terminated molecules. Please see FIGS. 13A, 13B and 13C.

The adhesion between the CVD dielectric layer 12 and the spin-on low-k silicate layer 18 using the adhesion promoter layer 14 in accordance with the method of the present invention is improved to preferably greater than about 0.30 GPa/√M (giga parcel/square root meter) and more preferably greater than about 0.5 GPa/√M so that subsequent chemical mechanical polishing processes do not delaminate the spin-on low-k silicate layer 18 from the CVD dielectric layer 12.

Proposed Mechanisms of Adhesion Enhancement

Figure 12A:
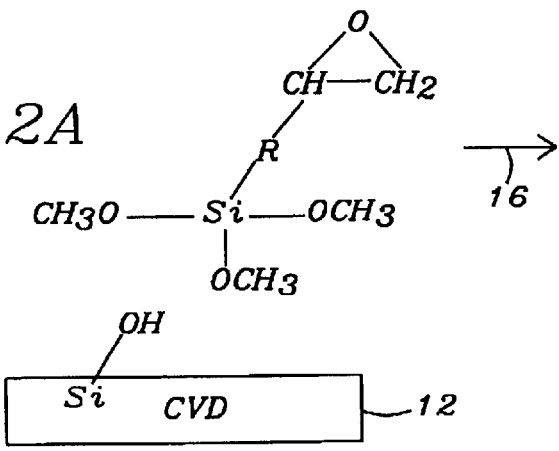
FIGS. 12A, 12B and 12C illustrate the mechanism believed to enhance adhesion between the CVD dielectric layer and the spin-on low-k layer using a sample first series of adhesion promotion molecules.
Figure 12B:
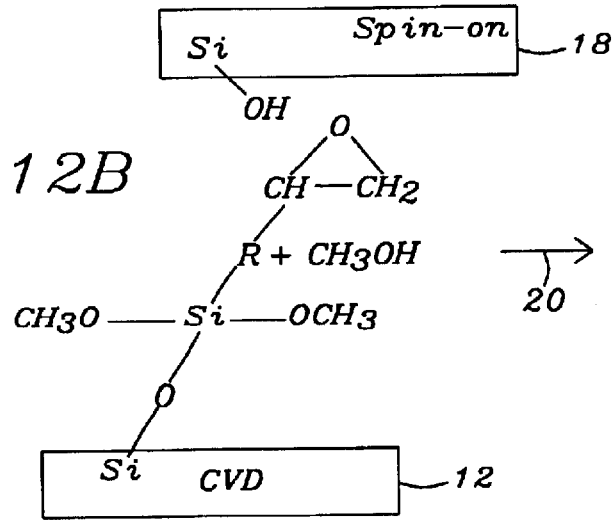
Figure 12C:
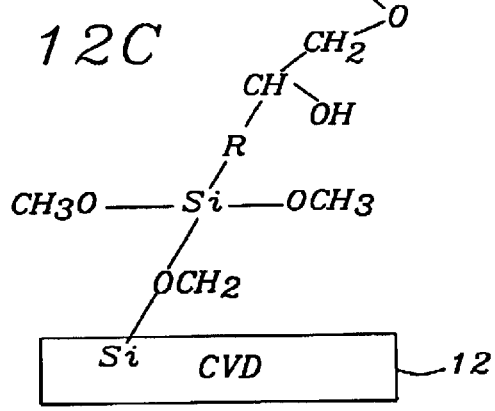
Figure 13A:
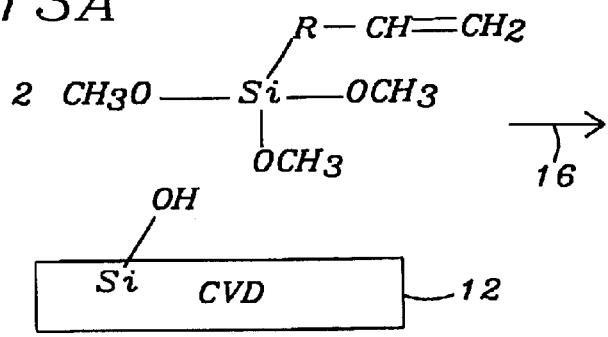
FIGS. 13A, 13B and 13C illustrate the mechanism believed to enhance adhesion between the CVD dielectric layer and the spin-on low-k layer using a sample second series of adhesion promotion molecules.
Figure 13B:
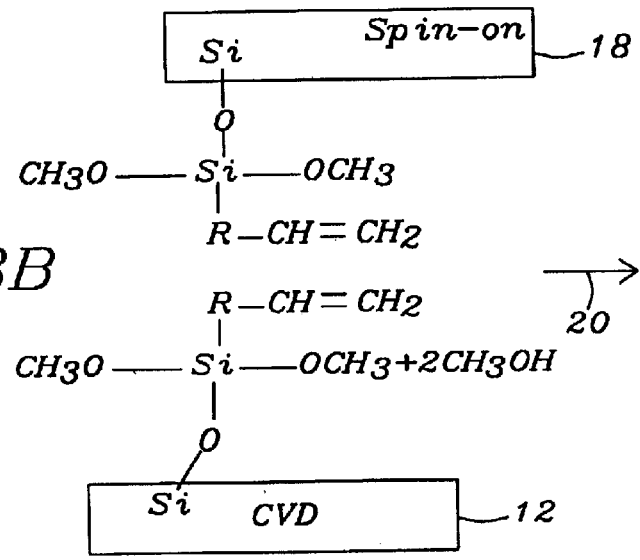
Figure 13C:
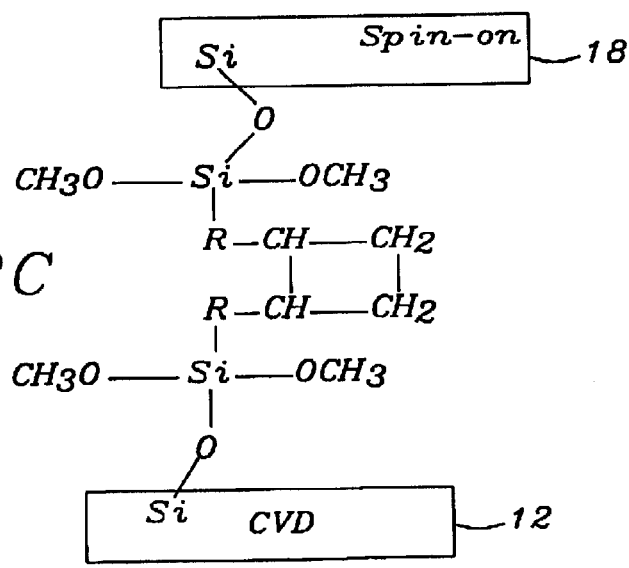

FIGS. 12A, 12B and 12C illustrate the mechanism believed by the inventors to enhance adhesion between the CVD dielectric layer and the spin-on low-k layer using a sample first series of adhesion promotion molecules; FIGS. 13A, 13B and 13C illustrate the mechanism believed to enhance adhesion between the CVD dielectric layer and the spin-on low-k layer using a sample second series of adhesion promotion molecules and FIGS. 14A, 14B and 14C illustrate the mechanism believed to enhance adhesion between the CVD dielectric layer and the spin-on low-k layer using a sample third series of adhesion promotion molecules.

Figure 14A:
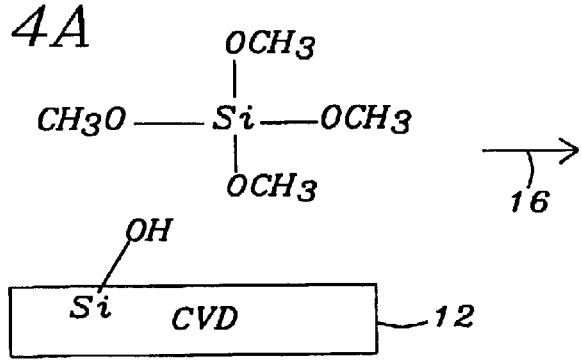
FIGS. 14A, 14B and 14C illustrate the mechanism believed to enhance adhesion between the CVD dielectric layer and the spin-on low-k layer using a sample third series of adhesion promotion molecules.

Each series of FIGS. 12A, 13A and 14A illustrate the upper surface of CVD dielectric layer 12 (with exposed —OH molecules) after being coated with adhesion promoter layer 14 comprising sample adhesion promotion molecules from the first, second and third series of adhesion promotion molecules, respectively.

Figure 14B:
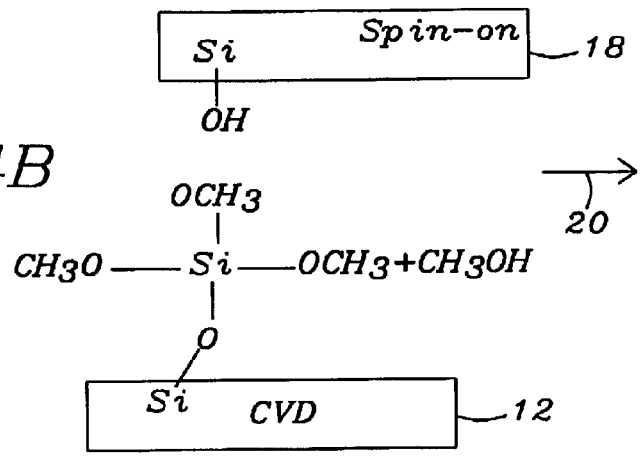

Each series of FIGS. 12B, 13B and 14B illustrate (1) the upper surface of CVD dielectric layer 12 after the low-temperature treatment 16 so that the upper surface of CVD dielectric layer 12 is bound to the sample adhesion promotion molecules from the first, second and third series of adhesion promotion molecules of the low-temperature treated adhesion promoter layer 14', respectively, and (2) the spin-on low-k silicate layer 18 is formed over the low-temperature treated adhesion promoter layer 14'.

Figure 14C:
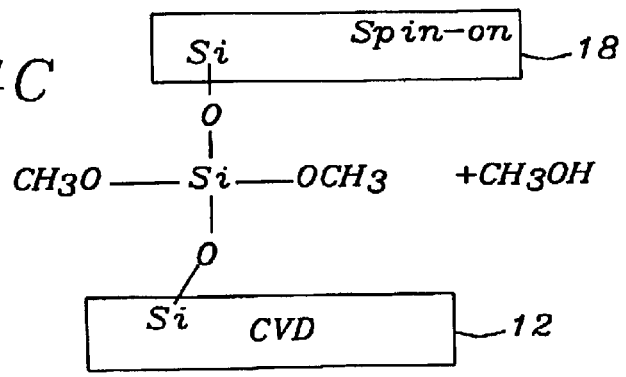

Each series of FIGS. 12C, 13C and 14C illustrate (1) the lower surface of spin-on low-k silicate layer 18 after the high-temperature treatment 20 so that the lower surface of spin-on low-k silicate layer 18 is bound to the sample adhesion promotion molecules from the first, second and third series of adhesion promotion molecules of the high-temperature treated adhesion promoter layer 14", respectively, and (2) the upper surface of CVD dielectric layer 12 bound to the sample adhesion promotion molecules from the first, second and third series of adhesion promotion molecules of the high-temperature treated adhesion promoter layer 14", respectively.

It is noted that FIG. 13C also demonstrates double bond cross-linking that also may occur.

Advantages of the Present Invention

The advantages of one or more embodiments of the present invention include greatly improving the adhesion between CVD dielectric layers and spin-on silicate layers.

While particular embodiments of the present invention have been illustrated and described, it is not intended to limit the invention, except as defined by the following claims.

We claim:

1. A method of adhering a silicate layer to dielectric layer, comprising the steps of:
   providing a structure having an overlying layer formed thereover;
   forming an adhesion promoter layer upon the layer; the adhesion promoter layer including adhesion promotion molecules;
   treating the layer and the adhesion promoter layer to a low-temperature treatment to bind at least some of the adhesion promotion molecules to the layer through a first Si—O group;
   forming a silicate layer upon the low-temperature treated adhesion promoter layer; and
   treating the silicate layer and the low-temperature treated adhesion promoter layer to a high-temperature treatment to bind at least some of the adhesion promotion molecules to the silicate layer through a second Si—O group or an R—O group; whereby the silicate layer is adhered to the dielectric layer.

2. The method of claim 1, wherein the structure is a silicon wafer or silicon substrate; the layer is a CVD dielectric layer; and the silicate layer is a spin-on low-k silicate layer.

3. The method of claim 1, wherein the layer is a CVD dielectric layer comprised of a material selected from the group consisting of $SiO_2$, SiC, SiON, SiOC, SiN, SiCNO; and the silicate layer is a spin-on low-k silicate layer comprised of a material comprising silicon, oxygen and carbon.

4. The method of claim 1, wherein the layer is:
   a CVD dielectric layer comprised of a material selected from the group consisting of $SiO_2$, SiC, SiON, SiOC, SiN and SiCNO; or
   a metal layer comprised of a metal selected from the group consisting of Cu, Al Au and Ag; and the silicate layer is a spin-on low-k silicate layer comprised of a material comprising silicon, oxygen and carbon.

5. The method of claim 1, wherein the layer has a thickness of from about 300 to 5000 Å; and the silicate layer has a thickness of from about 500 to 8000 Å.

6. The method of claim 1, wherein the layer has a thickness of from about 300 to 600 Å; and the silicate layer has a thickness of from about 3000 to 6000 Å.

7. The method of claim 1, wherein the adhesion promoter layer has a thickness of from about 20 to 300 Å.

8. The method of claim 1, wherein the adhesion promoter layer has a thickness of from about 50 to 150 Å.

9. The method of claim 1, wherein the low-temperature treatment is conducted at a temperature of 150 to 250° for from about 3 to 10 minutes.

10. The method of claim 1, wherein the low-temperature treatment is conducted at a temperature of 180 to 230° for from about 5 to 8 minutes.

11. The method of claim 1, wherein the low-temperature treatment is conducted at a temperature of 150 to 250° for from about 3 to 30 minutes.

12. The method of claim 1, wherein the low-temperature treatment is conducted at a temperature of 180 to 230° for from about 10 to 20 minutes.

13. The method of claim 1, wherein the high-temperature treatment is conducted at a temperature of 300 to 450° for from about 1 to 6 hours.

14. The method of claim 1, wherein the high-temperature treatment is conducted at a temperature of 350 to 420° for from about 2 to 4 hours.

15. The method of claim 1, wherein the adhesion between the silicate layer and the dielectric layer is greater than about 0.30 GPa/√M.

16. The method of claim 1, wherein the adhesion between the silicate layer and the dielectric layer is greater than about 0.5 GPa/√M.

17. The method of claim 1, wherein the adhesion promotion molecules are selected from the group consisting of:
   I. a) dihydroxyl terminated molecules;
   b) alkoxysilyl hydroxyl terminated molecules;
   c) alkoxysilyl terminated molecules;
   II. a) alkoxysilyl vinyl terminated molecules;
   b) hydroxyl vinyl terminated molecules;
   c) alkoxysilyl acryl terminated molecules;
   d) hydroxyl acryl terminated molecules;
   III. a) $(RO)_xSi(OR')_{4-x}$; and
   b) $(RO)_xSi(OR')_{3-x}H$.

18. The method of claim 1, wherein the adhesion promotion molecules are selected from the group consisting of; alkoxysilyl hydroxyl terminated molecules, alkoxysilyl terminated molecules, alkoxysilyl vinyl terminated molecules and alkoxysilyl acryl terminated molecules.

19. The method of claim 1, wherein the adhesion promotion molecules are alkoxysilyl terminated molecules.

20. A method of adhering a spin-on low-k silicate layer to a dielectric layer, comprising the steps of:
   providing a structure having an overlying CVD dielectric layer formed thereover;
   forming an adhesion promoter layer upon the CVD dielectric layer; the adhesion promoter layer including adhesion promotion molecules;
   treating the CVD dielectric layer and the adhesion promoter layer to a low-temperature treatment to bind at least some of the adhesion promotion molecules to the CVD dielectric layer through a first Si—O group;
   forming a spin-on low-k silicate layer upon the low-temperature treated adhesion promoter layer; and
   treating the spin-on low-k silicate layer and the low-temperature treated adhesion promoter layer to a high-temperature treatment to bind at least some of the adhesion promotion molecules to the spin-on low-k silicate layer through a second Si—O group or an R—O group; whereby the spin-on low-k silicate layer is adhered to the CVD dielectric layer.

21. The method of claim 20, wherein the structure is a silicon wafer or silicon substrate.

22. The method of claim 20, wherein the CVD dielectric layer is comprised of a material selected from the group consisting of $SiO_2$, SiC, SiON, SiOC, SiN, SiCNO; and the spin-on low-k silicate layer is a material comprising silicon, oxygen and carbon.

23. The method of claim 20, wherein the CVD dielectric layer has a thickness of from about 300 to 5000 Å; and the spin-on low-k silicate layer has a thickness of from about 500 to 8000 Å.

24. The method of claim 20, wherein the CVD dielectric layer has a thickness of from about 300 to 600 Å; and the spin-on low-k silicate layer has a thickness of from about 3000 to 6000 Å.

25. The method of claim 20, wherein the adhesion promoter layer has a thickness of from about 20 to 300 Å.

26. The method of claim 20, wherein the adhesion promoter layer has a thickness of from about 50 to 150 Å.

27. The method of claim 20, wherein the low-temperature treatment is conducted at a temperature of 150 to 250° for from about 3 to 10 minutes.

28. The method of claim 20, wherein the low-temperature treatment is conducted at a temperature of 180 to 230° for from about 5 to 8 minutes.

29. The method of claim 20, wherein the low-temperature treatment is conducted at a temperature of 150 to 250° for from about 3 to 30 minutes.

30. The method of claim 20, wherein the low-temperature treatment is conducted at a temperature of 180 to 230° for from about 10 to 20 minutes.

31. The method of claim 20, wherein the high-temperature treatment is conducted at a temperature of 300 to 450° for from about 1 to 6 hours.

32. The method of claim 20, wherein the high-temperature treatment is conducted at a temperature of 350 to 420° for from about 2 to 4 hours.

33. The method of claim 20, wherein the adhesion between the spin-on low-k silicate layer and the CVD dielectric layer is greater than about 0.30 GPa/√M.

34. The method of claim 20, wherein the adhesion between the spin-on low-k silicate layer and the CVD dielectric layer is greater than about 0.5 GPa/√M.

35. The method of claim 20, wherein the adhesion promotion molecules are selected from the group consisting of:
   I. a) dihydroxyl terminated molecules;
   b) alkoxysilyl hydroxyl terminated molecules;
   c) alkoxysilyl terminated molecules;
   II. a) alkoxysilyl vinyl terminated molecules;
   b) hydroxyl vinyl terminated molecules;
   c) alkoxysilyl acryl terminated molecules;
   d) hydroxyl acryl terminated molecules;
   III. a) $(RO)_xSi(OR')_{4-x}$; and
   b) $(RO)_xSi(OR^1)_{3-x}H$.

36. The method of claim 20, wherein the adhesion promotion molecules are selected from the group consisting of: alkoxysilyl hydroxyl terminated molecules, alkoxysilyl terminated molecules, alkoxysilyl vinyl terminated molecules and alkoxysilyl acryl terminated molecules.

37. The method of claim 20, wherein the adhesion promotion molecules are alkoxysilyl terminated molecules.

38. A method of adhering a spin-on low-k silicate layer to a dielectric layer, comprising the steps of:
   providing a structure having an overlying CVD dielectric layer formed thereover;
   forming an adhesion promoter layer upon the CVD dielectric layer; the adhesion promoter layer including adhesion promotion molecules; the adhesion promotion molecules being selected from the group consisting of:
   I. a) dihydroxyl terminated molecules;
   b) alkoxysilyl hydroxyl terminated molecules;
   c) alkoxysilyl terminated molecules;
   II. a) alkoxysilyl vinyl terminated molecules;
   b) hydroxyl vinyl terminated molecules;
   c) alkoxysilyl acryl terminated molecules;
   d) hydroxyl acryl terminated molecules;
   III. a) $(RO)_xSi(OR')_{4-x}$; and
   b) $(RO)_xSi(OR^1)_{3-x}H$;
   treating the CVD dielectric layer and the adhesion promoter layer to a low-temperature treatment to bind at least some of the adhesion promotion molecules to the CVD dielectric layer through a first Si—O group;
   forming a spin-on low-k silicate layer upon the low-temperature treated adhesion promoter layer; and
   treating the spin-on low-k silicate layer and the low-temperature treated adhesion promoter layer to a high-temperature treatment to bind at least some of the adhesion promotion molecules to the spin-on low-k silicate layer through a second Si—O group or an R—O group; whereby the spin-on low-k silicate layer is adhered to the CVD dielectric layer.

39. The method of claim 38, wherein the structure is a silicon wafer or silicon substrate.

40. The method of claim 38, wherein the CVD dielectric layer is comprised of a material selected from the group consisting of $SiO_2$, SiC, SiON, SiOC, SiN, SiCNO; and the spin-on low-k silicate layer is a material comprising silicon, oxygen and carbon.

41. The method of claim 38, wherein the CVD dielectric layer has a thickness of from about 300 to 5000 Å; and the spin-on low-k silicate layer has a thickness of from about 500 to 8000 Å.

42. The method of claim 38, wherein the CVD dielectric layer has a thickness of from about 300 to 600 Å; and the spin-on low-k silicate layer has a thickness of from about 3000 to 6000 Å.

43. The method of claim 38, wherein the adhesion promoter layer has a thickness of from about 20 to 300 Å.

44. The method of claim 38, wherein the adhesion promoter layer has a thickness of from about 50 to 150 Å.

45. The method of claim 38, wherein the adhesion promotion molecules being selected from the group consisting of:
   I. a) dihydroxyl terminated molecules;
   b) alkoxysilyl hydroxyl terminated molecules; and
   c) alkoxysilyl terminated molecules; and the low-temperature treatment is conducted at a temperature of 150 to 250° for from about 3 to 10 minutes.

46. The method of claim 38, wherein the adhesion promotion molecules being selected from the group consisting of:
   I. a) dihydroxyl terminated molecules;
   b) alkoxysilyl hydroxyl terminated molecules; and
   c) alkoxysilyl terminated molecules; and the low-temperature treatment is conducted at a temperature of 180 to 230° for from about 5 to 8 minutes.

47. The method of claim 38, wherein the adhesion promotion molecules being selected from the group consisting of:
   II. a) alkoxysilyl vinyl terminated molecules;

b) hydroxyl vinyl terminated molecules;
c) alkoxysilyl acryl terminated molecules;
d) hydroxyl acryl terminated molecules;
III. a) $(RO)_xSi(OR')_{4-x}$; and
b) $(RO)_xSi(OR^1)_{3-x}H$; the low-temperature treatment is conducted at a temperature of 150 to 2500 for from about 3 to 30 minutes.

48. The method of claim 38, wherein the adhesion promotion molecules being selected from the group consisting of:
II. a) alkoxysilyl vinyl terminated molecules;
b) hydroxyl vinyl terminated molecules;
c) alkoxysilyl acryl terminated molecules;
d) hydroxyl acryl terminated molecules;
III. a) $(RO)_xSi(OR')_{4-x}$; and
b) $(RO)_xSi(OR')_{3-x}H$; and the low-temperature treatment is conducted at a temperature of 180 to 230° for from about 10 to 20 minutes.

49. The method of claim 38, wherein the high-temperature treatment is conducted at a temperature of 300 to 450° for from about 1 to 3 hours.

50. The method of claim 38, wherein the high-temperature treatment is conducted at a temperature of 350 to 420° for from about 2 to 4 hours.

51. The method of claim 38, wherein the adhesion between the spin-on low-k silicate layer and the CVD dielectric layer is greater than about 0.30 GPa/√M.

52. The method of claim 38, wherein the adhesion between the spin-on low-k silicate layer and the CVD dielectric layer is greater than about 0.5 GPa/√M.

53. The method of claim 38, wherein the adhesion promotion molecules are selected from the group consisting of: alkoxysilyl hydroxyl terminated molecules, alkoxysilyl terminated molecules, alkoxysilyl vinyl terminated molecules and alkoxysilyl acryl terminated molecules.

54. The method of claim 38, wherein the adhesion promotion molecules are alkoxysilyl terminated molecules.

55. A method of adhering a silicate layer to dielectric layer, comprising the steps of:
providing a structure having an overlying layer formed thereover;
forming an adhesion promoter layer upon the layer; the adhesion promoter layer including adhesion promotion molecules;
treating the layer and the adhesion promoter layer to a low-temperature treatment to bind at least some of the adhesion promotion molecules to the layer;
forming a silicate layer upon the low-temperature treated adhesion promoter layer; and
treating the silicate layer and the low-temperature treated adhesion promoter layer to a high-temperature treatment to bind at least some of the adhesion promotion molecules to the silicate layer whereby the silicate layer is adhered to the dielectric layer; wherein the adhesion between the silicate layer and the dielectric layer is greater than about 0.30 GPa/√M.

56. The method of claim 53 wherein the adhesion between the silicate layer and the dielectric layer is greater than about 0.5 GPa/√M.

57. A method of adhering a spin-on low-k silicate layer to a dielectric layer, comprising the steps of:
providing a structure having an overlying CVD dielectric layer formed thereover;
forming an adhesion promoter layer upon the CVD dielectric layer; the adhesion promoter layer including adhesion promotion molecules;
treating the CVD dielectric layer and the adhesion promoter layer to a low-temperature treatment to bind at least some of the adhesion promotion molecules to the CVD dielectric layer;
forming a spin-on low-k silicate layer upon the low-temperature treated adhesion promoter layer; and
treating the spin-on low-k silicate layer and the low-temperature treated adhesion promoter layer to a high-temperature treatment to bind at least some of the adhesion promotion molecules to the spin-on low-k silicate layer whereby the spin-on low-k silicate layer is adhered to the CVD dielectric layer; wherein the adhesion between the spin-on low-k silicate layer and the CVD dielectric layer is greater than about 0.30 GPa/√M.

58. The method of claim 57, wherein the adhesion between the spin-on low-k silicate layer and the CVD dielectric layer is greater than about 0.5 GPa/√M.

59. A method of adhering a spin-on low-k silicate layer to a dielectric layer, comprising the steps of:
providing a structure having an overlying CVD dielectric layer formed thereover;
forming an adhesion promoter layer upon the CVD dielectric layer; the adhesion promoter layer including adhesion promotion molecules; the adhesion promotion molecules being selected from the group consisting of:
I. a) dihydroxyl terminated molecules;
b) alkoxysilyl hydroxyl terminated molecules;
c) alkoxysilyl terminated molecules;
II. a) alkoxysilyl vinyl terminated molecules;
b) hydroxyl vinyl terminated molecules;
c) alkoxysilyl acryl terminated molecules;
d) hydroxyl acryl terminated molecules;
III. a) $(RO)_xSi(OR')_{4-x}$; and
b) $(RO)_xSi(OR^1)_{3-x}H$;
treating the CVD dielectric layer and the adhesion promoter layer to a low-temperature treatment to bind at least some of the adhesion promotion molecules to the CVD dielectric layer;
forming a spin-on low-k silicate layer upon the low-temperature treated adhesion promoter layer; and
treating the spin-on low-k silicate layer and the low-temperature treated adhesion promoter layer to a high-temperature treatment to bind at least some of the adhesion promotion molecules to the spin-on low-k silicate layer whereby the spin-on low-k silicate layer is adhered to the CVD dielectric layer; wherein the adhesion between the spin-on low-k silicate layer and the CVD dielectric layer is greater than about 0.30 GPa/√M.

60. The method of claim 59, wherein the adhesion between the spin-on low-k silicate layer and the CVD dielectric layer is greater than about 0.5 GPa/√M.

* * * * *